United States Patent
Scholz

(10) Patent No.: US 6,825,093 B2
(45) Date of Patent: Nov. 30, 2004

(54) PROCESS WINDOW ENHANCEMENT FOR DEEP TRENCH SPACER CONSERVATION

(75) Inventor: Arnd R. Scholz, Dresden (DE)

(73) Assignee: Infineon Technologies AG, Munich (DE)

(*) Notice: Subject to any disclaimer, the term of this patent is extended or adjusted under 35 U.S.C. 154(b) by 259 days.

(21) Appl. No.: 10/243,492

(22) Filed: Sep. 13, 2002

(65) Prior Publication Data

US 2003/0064600 A1 Apr. 3, 2003

Related U.S. Application Data

(60) Provisional application No. 60/325,915, filed on Sep. 28, 2001.

(51) Int. Cl.$^7$ ............................................. H01L 21/331
(52) U.S. Cl. ........................ 438/386; 438/387; 438/393; 438/692
(58) Field of Search ................................ 438/386–396, 438/692

(56) References Cited

U.S. PATENT DOCUMENTS

| | | | | |
|---|---|---|---|---|
| 5,365,097 A | * | 11/1994 | Kenney | 257/302 |
| 5,641,694 A | * | 6/1997 | Kenney | 438/156 |
| 5,744,386 A | * | 4/1998 | Kenney | 438/245 |
| 6,608,341 B2 | * | 8/2003 | Schrems | 257/301 |
| 6,740,555 B1 | * | 5/2004 | Tews et al. | 438/242 |
| 2003/0003653 A1 | * | 1/2003 | Malik et al. | 438/248 |

* cited by examiner

Primary Examiner—Duy-Vu Deo
(74) Attorney, Agent, or Firm—Slater & Matsil, L.L.P.

(57) ABSTRACT

In a process for manufacturing deep trench (32) memory cells, a method of enhancing the process window by better protecting the nitride spacer (52) prior to the process of stripping the pad nitride layer (38). The method also provides for the deposition of a nitride liner (64) and offers an additional advantage of not requiring the top shoulder (58) of the nitride spacer (52) to be over etched during its formation.

7 Claims, 3 Drawing Sheets

PROCESS WINDOW ENHANCEMENT FOR DEEP TRENCH SPACER CONSERVATION

This patent claims the benefit of U.S. Provisional Patent Application Ser. No. 60/325,915, filed on Sep. 28, 2001.

FIELD OF THE INVENTION

This invention relates generally to a trench DRAM memory cell and more specifically to a process method for providing process window enhancement to protect the DT (deep trench) top structure of a vertical gate transistor during subsequent processing of the AA (active area).

BACKGROUND OF THE INVENTION

The primary driving motivator in commercial memory cells and architecture is the desire to pack more memory capability into a smaller integrated circuit. This goal necessarily involves competing trade-offs in cost, circuit complexity, power dissipation, yield, performance, and the like. Trench capacitors are known in the art as an architecture whereby the overall size (in terms of surface area or chip "real estate") of the memory cell is reduced. The size reduction is accomplished by forming the capacitor of the memory cell in a trench.

As is known in the art, a typical DRAM cell includes a capacitor upon which is stored a charge (or no charge depending upon the cell's state) and a pass transistor, which is used to charge the capacitor during writing and in the read process to pass the charge on the capacitor to a sense amplifier. In most recent manufacturing, planar transistors are used for the pass transistors. Such planar transistors have a critical dimension of gate length that is typically 110 nm or greater. Below that size, the transistor performance becomes degraded and is very sensitive to process tolerances. As such, for DRAM cells that are desired to be shrunk below a roughly 110 nm ground rule, existing planar transistors cannot provide the performance necessary for proper DRAM cell operation. A need exists, therefore, for a DRAM memory cell employing a pass transistor architecture that maintains acceptable performance even when shrunk to very small dimensions. Deep trench memory cells combined with a vertical pass transistor represent one approach to meet this challenge.

A method of manufacturing deep trench memory cell comprises: forming a buried plate within a semiconductor substrate, forming a deep trench having sidewalls within an active area of a semiconductor substrate, forming a trench collar oxide along the sidewalls of the deep trench. The method further comprises filling the trench with polysilicon. After subsequently etching the poly in the trench, the method further comprises etching the trench collar which leaves a divot and then filing the divot with polysilicon A trench top oxide is then formed on the trench and divot polysilicon, filling the trench with a gate polysilicon above the trench top oxide, forming a first doped region adjacent one sidewall of the trench and a second doped region adjacent another sidewall of the trench. These steps are followed by forming a contact to the gate polysilicon and connecting the gate polysilicon to a word line, and forming a contact to the first and second doped regions and connecting the first and second doped regions to a bit line.

The method also provides for forming the capacitor of the memory circuit being formed in a lower portion of a trench, and further comprises a logical pass transistor having a vertical gate formed within an upper portion of the trench, along with a source region, a drain region, and a gate with a gate oxide adjacent the source and drain regions.

As will be appreciated, one problem area in the manufacturing process is protecting a nitride spacer from damage that often results during processing steps such as stripping of the pad nitride layer. Therefore, it would be advantageous to provide a simple and efficient method of "enhancing the process window" by protecting the nitride spacer.

SUMMARY OF THE INVENTION

Enhancement of the process window and protection of the nitride spacer, according to the present invention, is achieved in a process for manufacturing deep trench memory cells in a substrate covered by a pad nitride layer, which in turn is covered by an oxide layer. The deep trench memory cell also includes a polysilicon gate (or sometimes referred to as a poly gate) that fills the trench to a level below the bottom surface of the pad nitride layer. Further according to the process steps, a nitride layer is formed over the layer of oxide and the side walls of the trench down to the top surface of the gate poly. The nitride layer is then etched to form a nitride spacer that has a top shoulder which is spaced less than about 40–50 nm below the top surface of the pad nitride layer. The spacer also extends down to the top surface of the gate poly so as to define an aperture surrounded by the nitride spacer. The aperture is then filled with a poly stud that extends from the gate poly to a level just slightly below the top surface of the pad nitride layer. A nitride liner is then formed over the poly stud.

BRIEF DESCRIPTION OF THE DRAWINGS

The above features of the present invention will be more clearly understood from consideration of the following descriptions in connection with accompanying drawings in which.

DETAILED DESCRIPTION OF ILLUSTRATIVE EMBODIMENTS

The making and use of the various embodiments are discussed below in detail. However, it should be appreciated that the present invention provides many applicable inventive concepts, which can be embodied in a wide variety of specific contexts. The specific embodiments discussed are merely illustrative of specific ways to make and use the invention, and do not limit the scope of the invention.

Figure 1:
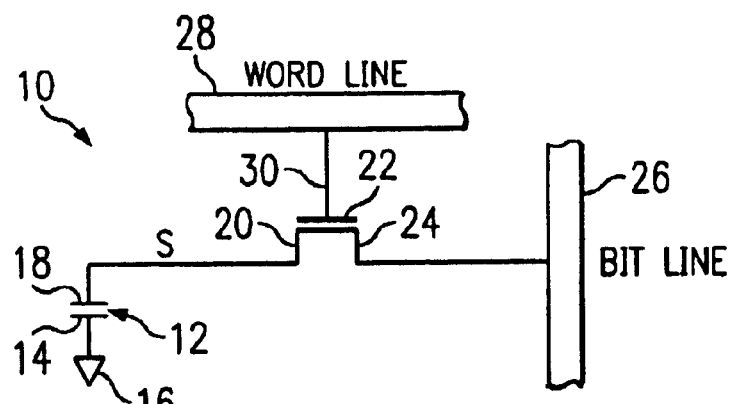
FIG. 1 shows an electrical schematic of a memory cell.

FIG. 1 provides a schematic illustration of a typical memory cell. The cell 10 comprises a charge storage capacitor 12 having one plate 14 tied to a reference voltage 16 (typically ground as shown in FIG. 1 or half of the bitline voltage) and having its other plate 18 tied to the source 20 of pass transistor 22. Pass transistor 22 has its drain 24 tied to bit line 26 and its gate tied to word line 18, as is well known in the art. As will be described in greater detail below, in the preferred embodiments of the present invention, charge storage capacitor 12 is formed within a deep trench, as is the source region for the pass transistor. Additionally, and as will be discussed, the gate 30 of pass transistor is formed within the upper region of the deep trench, above the trench top oxide (TTO).

Figure 2A:
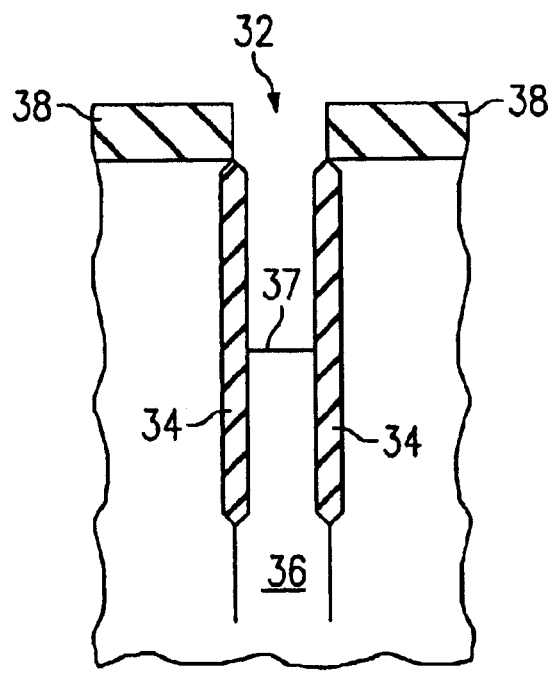
FIGS. 2A through 2E illustrate process steps in fabricating an embodiment of a memory cell according to the present invention.
Figure 2B:
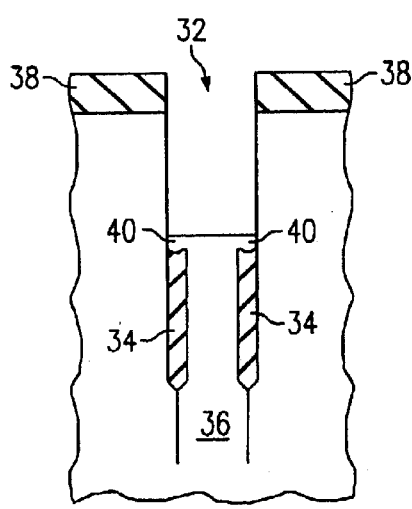

A preferred embodiment process flow for forming the above described memory cell according to the teachings of this invention is discussed with reference to FIGS. 2A through 2E and FIGS. 4A and 4B. In FIG. 2A, a deep trench 32 has been formed, trench collar oxide 34 has been formed and the trench has been filled with polysilicon 36 and the polysilicon 36 has been recessed back to a desired level 37 within the trench, all as is well known in the art. Nitride layer 38 protects the surrounding silicon during the etch step for recessing the polysilicon. As shown in FIG. 2B, the trench collar oxide has also been etched or recessed back, preferably using a wet etch technique. The oxide recess will typically result in a divot where the collar oxide 34 is removed below the level of polysilicon fill 36. An optional thin oxidation or nitridation can also be performed. The divot is filled in by re-filling the trench with polysilicon 40 and then recessing the polysilicon to leave polysilicon 40 in the divot, as shown. This polysilicon 40 in the divot can be either slightly doped or undoped poly and is preferably recessed or etched using any suitable technique such as a wet etch. This polysilicon 40 in the divot may also be subsequently doped by polysilicon 36 out-diffusing. Thus, the doped polysilicon in the divot forms a buried strap region.

The formation of the TTO (trench top oxide) 42 is now described with reference to FIG. 2C. This is accomplished by forming a trench top oxide layer 42 on the horizontal trench surface(the region above the polysilicon 36 and the polysilicon 40 in the divot). In addition, a layer of oxide 44 is also formed on the top surface of the nitride layer 38 at the same time. Oxide layers 42 and 44 may be formed by using an HDP (High Density Plasma) process with a wet chemistry etch back. One skilled in the art will recognize that the HDP oxide deposition fills in from the bottom to the top in contrast to a conformal deposition, where the oxide layer thickness is deposited uniformly. Due to the fact that the HDP oxide deposition covers the horizontal regions with a thicker deposition than the sidewalls, the oxide on the sidewalls can be subsequently removed by etching and still leave an oxide layer on the horizontal areas. Preferably the resulting oxide layers (42 and 44) thickness is around 30 nm. Optionally, a nitride wet etch can be performed to remove any overhang of the nitride layer 38 in the trench 32. After formation of the TTO layer 42, the sacrificial oxide layer on the sidewall is removed, thus providing a clean deep trench sidewall surface for subsequent growing of the gate oxide 46. After gate oxide 46 has been formed, gate polysilicon 48 is deposited within the deep trench. Preferably, the deep trench is overfilled with gate polysilicon followed by a chemical mechanical polish (CMP) to the top of nitride layer 38 or oxide layer 44. The polysilicon 48 is then etched to recess the top surface approximately 70 nm below the surface of the bulk silicon surrounding deep trench 32. The 70 nm recess is a matter of design choice, provided that the recess is within the junction depth of the transistor drain region in order to ensure no overlap of the junction to the gate.

Figure 2D:
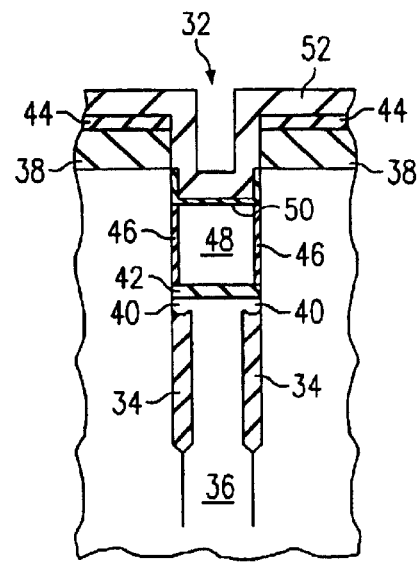
Figure 2C:
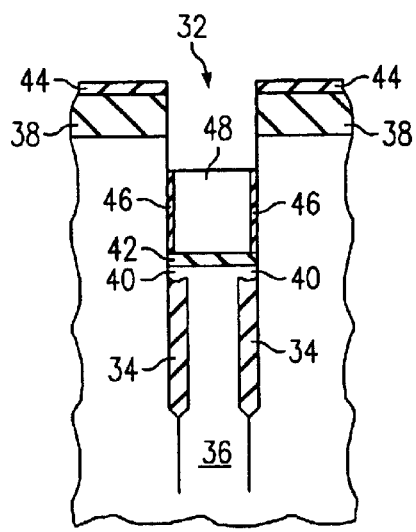

As shown in FIG. 2D, the exposed surfaces of the bulk silicon and of gate polysilicon 48 are then oxidized forming oxide layer 50. Nitride layer 52 is then formed. Nitride layer 52 is preferably formed by a CVD deposition and is generally about one third of the trench width. Although not illustrated, in some embodiments junction extensions could be self-aligned implanted with an angle at this step as well.

Figure 2E:
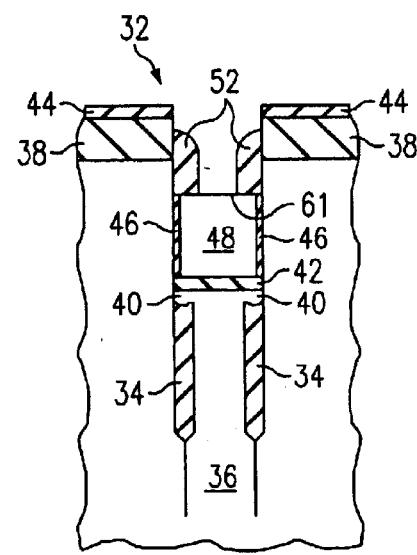

FIG. 2E illustrates the subsequent step in which the nitride liner is etched back to form the nitride spacer 52.

Figure 3A:
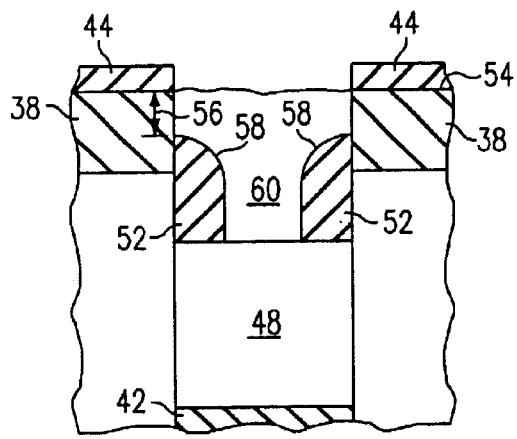
FIGS. 3A and 3B illustrate the prior art steps of etching the nitride spacer substantially below the top surface of the pad nitride layer to assure sufficient protection of the nitride spacer by the deposited poly stud.
Figure 3B:
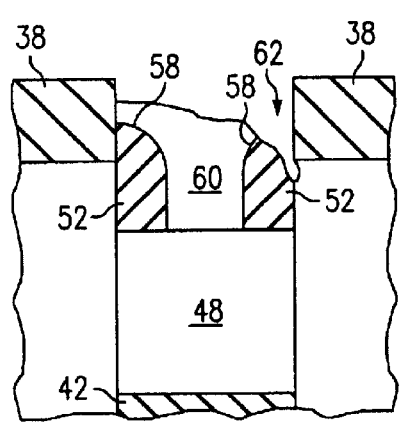

To this point in the manufacturing process, it will be appreciated by those skilled in the art that the earlier used process and the process of this invention may be the same. However, referring now to FIGS. 3A and 3B, there is illustrated an earlier used process of etching the nitride spacer deposition 52 to a level significantly below the top surface 54 of the pad nitride layer 38, such as for example, at least 40 to 50 nm below the pad nitride surface—such as indicated by double-headed arrow 56. Such sever etching is necessary in the previous process to assure that there will be sufficient poly above shoulder 58 of the nitride spacer 52 after CMP of the poly stud when the pad nitride layer 38 is stripped in a subsequent step to be discussed hereinafter. FIG. 3A also shows a poly stud 60 filing the aperture defined by nitride spacer 52. As shown in FIG. 3A, poly stud 60 extends well above the top shoulder 58 of the spacer 52. In addition and perhaps even more important with respect to the earlier used process, is the need to protect the spacer 52 during the subsequent step of stripping the pad nitride layer 38. For example, and as will be understood by those skilled in the art, the pad nitride layer 38 will typically be reduced or thinned by 10 nm to 20 nm during an AA (active area) oxide CMP (chemical mechanical polish). There will also be a deglaze of 20 nm of the AA oxide before stripping the pad nitride layer. Consequently, the AA oxide level may be only slightly spaced above the highest part or shoulder 58 of the deep trench nitride spacer 52. It will be appreciated that if the poly level were to be reduced below the level of the spacer shoulder 58, the spacer 52 would be etched out or damaged during the pad nitride 38 striping process as indicated at the etched out area 62 shown in FIG. 3B.

Therefore, in accordance with the present invention, it will be appreciated that a significant enhancement of the process window for the nitride spacer conservation can be achieved by protection of the deep trench poly stud 60 during the AA processing. Thus, if the amount of poly silicon consumption can be significantly reduced, the level at which the shoulder or spacer 52 must be pulled below the pad nitride 38 level can also be significantly reduced. This means that less over etch is necessary during the spacer etch process. Therefore, the process window will be improved for the pad nitride corner erosion since better protection of the poly stud from the top during the AA process will allow the shoulder 58 of the spacer to be maintained closer to the pad nitride surface 54. Thus, as mentioned above, the spacer shoulder 58 will be closer to the AA oxide level.

Figure 4A:
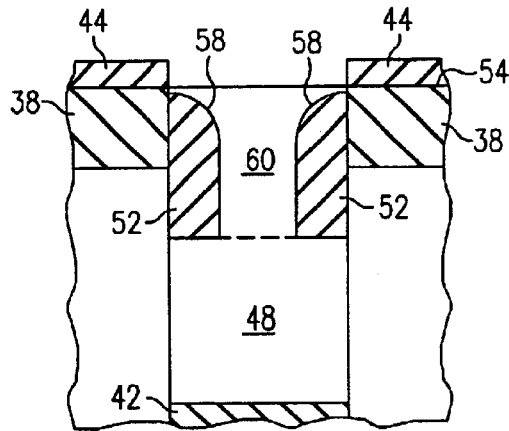
FIGS. 4A and 4B illustrate the reduced etching of the nitride spacer and the application of the nitride liner for protecting the nitride spacer according to the teaching of the present invention.
Figure 4B:
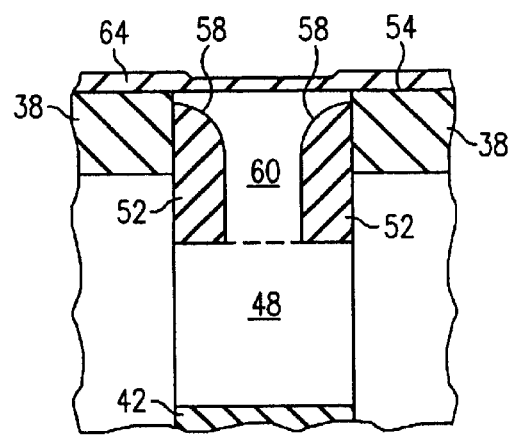

Therefore, referring now to FIGS. 4A and 4B, there is shown the improved process steps according to the present invention. Thus, as shown in FIG. 4A, it can be seen that the nitride spacer 52 has been pulled down or etched significantly less than required by the previous process. Thus, when the poly stud 60 is reduced by a suitable method, such as by CMP down to the oxide layer 44 (deposited at the time of TTO layer 42), the shoulder 58 of the nitride spacer 52 is substantially at the same level as the surface 54 of the pad nitride layer 38.

Referring again to FIG. 2E, reduced etching of the nitride spacer 52 according to this invention is followed by an ozone cleaning process to remove any accumulation of debris from the top surface of the gate polysilicon 48. The ozone cleaning process may result in another oxide layer 61 being formed on the surface of gate polysilicon 48. Oxide layers 48 and 61 are then removed by an oxide etch. Alternatively, the oxide layer 44 could have been removed earlier by a stripping process.

Additional polysilicon is then deposited over the top of the gate polysilicon 48 as shown in FIG. 4A, resulting in a polysilicon stud 60 (which is preferably integral with gate polysilicon 48). Preferably the polysilicon stud 60 is overfilled and then subjected to a CMP planarizing step back to the oxide layer 44. This step is then followed by a wet etch to remove the oxide layer 44 as is clearly seen in FIG. 4A. The poly silicon stud 60 is then touched up.

Referring now to FIG. 4B, it is seen that a sacrificial nitride liner 64 is deposited to a level of between about 10 nm and 15 nm, and preferably about 10 nm over the top of the pad nitride 38 and the poly stud 60. Thus, it should be appreciated that the present invention has enhanced or enlarged the process window for various subsequent processing steps familiar to persons skilled in the art that will typically be required. After the subsequent processing steps are completed, the nitride pad 38 and liner 64 are stripped away according to one or more processes well known to those skilled in the art.

Thus, it will be appreciated that the above process steps of this invention are designed to encapsulate and protect the nitride spacer 52 by oxide or polysilicon 60. This encapsulation assures that the nitride spacer 52 cannot be stripped away when the pad nitride layer 38 is removed. An added benefit is that the requirement for a fill and etch back to conserve the nitride spacer is eliminated.

It will also be appreciated that to protect the side of the spacer cut by the AA trenches, an oxide is needed on the surface. This can be accomplished by using the ISSG RTP oxidation process, mentioned above, to form a nitride oxide on the open spacer surface. As will be appreciate by those skilled in the art, such a nitride oxide surface offers significant protection against the process of stripping the pad nitride, and also results in a very slow etch rate from a BHF wet etch such that a significant liner thickness remains after the deglaze step. Consequently, the liner retains significant thickness at the time of stripping the pad nitride.

Assuming the deposition of a 10 nm to 15 nm nitride liner as set out above, and an AA oxidation step resulting in an oxide thickness of about 10 nm, it will be appreciate that there will be a significant reduction in thermal budget and approximately 5 nm of the nitride liner will be converted to a nitride oxide. Thus, 5 nm to 10 nm of nitride oxide will remain after the AA oxide CMP.

As will be appreciated by those skilled in the art, the CMP process will remove at least 10 nm of the nitride liner. Therefore, the nitride liner will be completely gone after planarization. Even if the CMP process applied to the poly stud 60 resulted in "dishing" of the poly stud and some of the nitride liner 64 remained, the nitride will be stripped or removed when the pad nitride 38 is removed.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For instance, exemplary insulative materials have been disclosed, such as oxide and nitride, although in some instances these materials can be substituted for each other, or other insulative materials could be employed. Conductive materials have also been disclosed, but it is within the scope of the present invention to employ other combinations of the disclosed or other conductive materials, such as now commonly employed in the art or subsequently developed. Certain spacings and dimensions have been disclosed regarding the currently contemplated best mode of the invention. These dimensions are not intended to be limiting in any manner and the present invention contemplates larger or smaller devices. Additionally, the present teaching may be applicable to other semiconductor materials and process, such as Germanium, Gallium-Arsenide, other III–IV materials, or other semiconductor materials. Other etch processes than specifically described above are within the scope of the present invention, including reactive ion etching (RIE), wet etching, dry etching, plasma etching, and the like. Likewise, the deposition techniques described herein are exemplary, rather than limiting and the present invention is broad enough to include other deposition techniques such as CVD, PVD, PEVD, thermal oxidation, and the like. It is intended that the appended claims encompass any such modifications or embodiments.

What is claimed is:

1. In a process for manufacturing deep trench memory cells in a substrate covered by a pad nitride layer with a top surface and a bottom surface, and having a layer of oxide covering the top surface of said pad nitride layer, and a gate poly filling said trench to a level below the bottom surface of said paid nitride layer, said process further comprising the steps of:

forming a nitride layer over said layer of oxide and the said walls of said trench down to the top surface of said gate poly;

etching said nitride layer to form a nitride spacer having a top shoulder proximate the top surface of said pad nitride layer and extending to the top surface of said gate poly thereby defining an aperture surrounded by said nitride spacer;

filing said aperture with a poly stud extending from said gate poly to a level above the top shoulder of said nitride spacer; and forming a nitride liner over said pad nitride layer and said poly stud.

2. The process of claim 1 wherein said top shoulder of said nitride spacer is etched to less than 40 nm below the top surface of said pad nitride layer.

3. The process of claim 2 wherein said poly stud extends to a level above the top surface of said pad nitride layer.

4. The process of claim 1 wherein said poly stud is integrated with said gate poly.

5. The process of claim 1 wherein said step of filing said aperture with a poly stud comprises the steps of over filing said aperture with poly and then planarizing said poly back to an oxide layer by CMP (chemical mechanical polishing).

6. The process of claim 1 and further comprising the step of wet etching after said filing step and prior to said step of forming a nitride liner.

7. The process of claim 1 wherein said nitride liner is between about 10 nm and 15 nm.

* * * * *